United States Patent [19]
Reffay

[11] Patent Number: 6,016,079
[45] Date of Patent: Jan. 18, 2000

[54] POWER AMPLIFIER DEVICE

[75] Inventor: Marius Reffay, Grenoble, France

[73] Assignee: SGS-Thomson Microelectronics S.A., Saint Genis, France

[21] Appl. No.: 09/016,606

[22] Filed: Jan. 30, 1998

[30] Foreign Application Priority Data

Feb. 14, 1997 [FR] France ................................ 97 01758

[51] Int. Cl.$^7$ .............................. H03F 3/45; H03F 1/14
[52] U.S. Cl. ...................... 330/255; 330/259; 330/292
[58] Field of Search .................................. 330/255, 292, 330/260, 265, 259

[56] References Cited

U.S. PATENT DOCUMENTS 4,232,273 11/1980 Leidich .................................... 330/298
4,521,740 6/1985 Nakayama ............................... 330/267

FOREIGN PATENT DOCUMENTS

WO 95 17041 6/1995 WIPO .............................. H03F 1/32

OTHER PUBLICATIONS

French Search Report from French Patent Application 97 01758, filed Feb. 14, 1997.
Patent Abstracts of Japan, vol. 011, No. 065 (E–484), Feb. 27, 1987 & JP–A–61 224507 (Toshiba Corp.).

W.M. Leach, Jr.: "Suppression of Slew–Rate and Transient Intermodulation Distortions In Audio Power Amplifiers", Journal of the Audio Engineering Society, vol. 25, No. 7/8, Jul. 1977, New York, US pp. 466–473.

*Primary Examiner*—Benny Lee
*Assistant Examiner*—Patricia T. Nguyen
*Attorney, Agent, or Firm*—Wolf, Greenfield & Sacks, P.C.

[57] ABSTRACT

A power amplifier device is disclosed, comprising a differential amplifier with determined transconductance followed by an intermediate amplification stage with a compensation capacitor between its output and its input and a push-pull output amplifier under low output impedance, for which the common point of connection between an upper stage and a lower stage gives an output of the device. A feedback loop between the output and the differential amplifier is provided in order to temporarily increase the transconductance of the differential amplifier at the passage of the conduction from one stage to the other stage of the push-pull amplifier.

35 Claims, 2 Drawing Sheets

POWER AMPLIFIER DEVICE

BACKGROUND OF THE INVENTION

1. Field of the Invention

The present invention relates to a power amplifier device. It can be applied generally to low-frequency amplification and particularly to the low-frequency amplifiers of frame deflection circuits in television sets.

In an application of this kind, the power amplifier has the role of activating the vertical deflection of the electron beam of the cathode-ray tube supplying a deflection coil by means of a sawtoothed current. The amplifier must have high gain to deliver a high AC current of about 1 to 3 amperes peak to peak at output.

2. Discussion of the Related Art

It is habitual, for this purpose, to use a power amplifier of the type shown in FIG. 1, with a differential amplifier 1 (e+, e−) followed by an intermediate amplification stage 2 with a compensation capacitor C between its output and its input (to obtain the Miller effect) and a push-pull output amplifier 3 designed to obtain a low output impedance, a maximum sweep of the output signal and high efficiency.

The principle of the push-pull assembly consists in placing two series-connected transistors between the two supply rails, the output terminal being taken at the common connection point between the two transistors, so that only one transistor is conductive depending on the sign of the half-wave of the input signal. This push-pull amplifier can be made by bipolar technology, preferably using a common collector assembly (or follower emitter assembly) for the application referred to herein.

In recent technological developments, in particular so as not to have the problem of a second breakdown of the bipolar transistors, it is preferred to use MOS technology and more particularly an assembly using complementary MOS transistors with common sources are shown in FIG. 2. This assembly requires a command that can be used to improve the output voltage sweep. Thus, rail to rail assemblies have been developed in order to give a maximum voltage sweep at the output that is as close as possible to the voltage difference between the two supply rails or lines obtained by biasing the MOS transistors to the limit of their linear zone under low output impedance.

A well-known general problem related to the use of push-pull output amplifiers is that of connection distortion, also called intersection distortion. This distortion corresponds to the passage of conduction from one transistor to another, for example when the input voltage is no longer positive enough for the upper transistor but is not negative enough to make the lower transistor conductive.

A known approach to resolving this problem consists in making the two transistors simultaneously conductive at rest. This is the class AB or class A operation. FIG. 2 thus shows an example of a class AB assembly used for an amplifier using complementary MOS transistors with common sources. It has two complementary transistors M1 and M2 which are respectively a P channel transistor and an N channel transistor, series-connected between a positive supply rail V+ and a negative supply rail V−(generally the ground). The transistor M1 forms the upper stage while the transistor M2 forms the lower stage, the drains of the two transistors connected in common giving an output terminal OUT of the amplifier. The gate of the transistor M2 forms an input terminal E of the amplifier. A transistor M3 and a transistor M4, respectively a P channel transistor and an N channel transistor, are series-connected between the positive supply rail V+ and the input terminal. The transistor M3 is mounted as a current mirror with the transistor M1. Its gate and its drain are thus connected in common to the gate of the transistor M1.

A source 1 of current I is applied to the drain of an N channel transistor M5. This transistor M5 is mounted as a current mirror with the transistor M4. It thus has its gate and its drain connected in common to the gate of the transistor M4. The source of the transistor M5 is connected to the negative supply rail V-by means of an N channel transistor M6.

This N channel transistor M6 has a geometrical ratio K with respect to the transistor M2 that is the same as the ratio between the transistors M1 and M3. Thus, if the input point IN is open (high impedance), there is a quiescent current I0 equal to K·I. The transistors M5 and M4 are biased on the same current. They therefore have an identical gate-source voltage Vgs. If ID refers to the drain current, this means that Vgs(M6)=Vgs(M2)=>ID(M6)=K·ID(M2)=K·I. Similarly, ID(M3)=ID(M4)=I=>ID(M1)=K·ID(M3)=K·I.

This quiescent current I0 is used to reduce the distortion since the output transistor, which is not conductive in the half-wave considered, is made conductive before the other transistor has finished being conductive.

In view of the variations (technological and temperature variations), experience shows that the nominal quiescent current must be about 10 to 15 mA for a peak-to-peak output current of 2 to 3 A.

Thus, the trade-off against the reduction of the connection distortion entails an additional power dissipation that has a non-negligible effect on the efficiency of the power amplifier.

SUMMARY OF THE INVENTION

Hence, in the invention, it is sought to reduce the effects of the connection distortion in another way so as not to cause any deterioration in efficiency.

When the connection distortion is reduced by setting a quiescent current I0, the transconductance of the output stage is prevented from becoming excessively reduced. There is more gain and the output follows the input more rapidly.

According to one aspect of the invention, it has thus been sought to reduce the connection distortion by increasing the gain in another way. It is known that the passband of the power amplifier device is limited by the output push-pull amplifier so that it can meet conditions of stability. If the reasoning is based on the push-pull amplifier of FIG. 2, where gm denotes the transconductance of a transistor, R0 the equivalent series resistance on the gate, Cgd the gate-drain capacitance, Cgs the gate-source capacitance and Z the output charge, the expression of the secondary pole is given by the following expression: $F1=\frac{1}{2}p(Cgs+gm\cdot Z\cdot Cgd)$.

When the push-pull amplifier is highly conductive (with M1 or M2 at the limit of the linear zone), the transconductance gm of the transistor, which is proportional to the square root of the drain current, is high and the gate-drain capacitance of the transistor at the limit of the linear zone is also high. By Miller effect, this gives a very high value (gm·Z·Cgd) that dictates a low value of the secondary pole F1. This low value of the secondary pole is the lowest value of all the secondary poles that could appear in the different stages. It is therefore this value that limits the value of the main pole Fgb of the amplifier device to meet the criterion of stability: it is necessary to have Fgb<F1.

Now, the main pole is given by the transconductance gm1 of the input differential amplifier and the compensation capacitor (obtained by Miller effect) of the intermediate stage. The unit gain frequency Fgb (or transition frequency or gain-band product) which is the frequency for which the current gain is equal to one, is thus given by the following expression: Fgb=gm1·½ πC, and must be lower than the value of the secondary pole dictated by the output stage when this stage is highly conductive. In practice, it is thus necessary to limit the value of the transconductance gm1.

Now, the value of the secondary pole F1 of the output amplifier moves away, when the conductivity of this output amplifier becomes low, at the passage of conduction from one stage to another. With the current becoming reduced, the transconductance of the transistor is diminished, and so is the gate-drain capacitance. The phase margin at this time is therefore higher.

If, at this time, the gain of the amplifier device could be increased temporarily, it would be possible in this way to reduce the connection distortion, even in the absence of simultaneous conduction set at quiescent current (class B). In practice, it is easy to modify the transconductance gm1 of the differential input amplifier.

Thus, in the invention, to reduce the connection distortion of the push-pull output amplifier, the technical solution found has been that of detecting the passage of conduction from one stage to another so as to temporarily increase, at this instant, the transconductance gm1 of the input differential amplifier.

This detection can be done in voltage or in current. The temporary increase of the transconductance of the differential amplifier is obtained by the application to it of an additional current for the biasing of its differential input stage.

According to one embodiment of the invention, a power amplifier device is disclosed, comprising a differential amplifier with determined transconductance followed by an intermediate amplification stage with a compensation capacitor between its output and its input and a push-pull output amplifier under low output impedance. A common point of connection between an upper stage and a lower stage gives an output of the device. The device further comprises a feedback loop between the output and the differential amplifier to temporarily increase the transconductance of the differential amplifier at the passage of the conduction from one stage to the other stage of the push-pull amplifier. The differential amplifier comprises a biasing node for biasing differential inputs of the differential amplifier and receiving a determined biasing current. The feedback loop includes means for applying an additional current to the biasing node of the differential amplifier, the current applying means being controlled by detection means for detecting the passage of conduction from one stage to another of the push-pull amplifier.

According to another embodiment of the invention, a power amplifier is disclosed comprising first amplifying means having a differential input and an output, second amplifying means having an input connected to the output of the first amplifying means and an output, the input and output of the second amplifying means being connected to each other through a capacitor. The device further comprises third amplifying means having an input connected to the output of the second amplifying means and an output, the output of the third amplifying means being formed by a connection of a first stage and a second stage of the third amplifying means and which outputs an output voltage and a feedback loop coupled between the output of the third amplifying means and a bias node of the first amplifying means, the feedback loop comprising bias means for increasing a transconductance of the first amplifying means upon the transfer of conduction from one of the first and second stages to the other of the first and second stages.

According to another embodiment of the invention, a method for reducing connection distortion in a push-pull amplifier device is disclosed. The method comprises the steps of supplying a bias current to a bias node of the push-pull amplifier device, monitoring an output of the push-pull amplifier device, detecting a transfer of conductance in the push-pull amplifier device and supplying a additional current to the bias node of the push-pull amplifier device when a transfer of conductance is detected in the detecting step.

The invention can be applied generally to all power amplifiers or to push-pull output amplifiers. It is especially valuable for application with a push-pull amplifier using complementary MOS transistors with common sources controlled in order to have a maximum output dynamic range.

BRIEF DESCRIPTION OF THE DRAWINGS

Other features and advantages of the invention are described in detail in the following description given by way of a non-restrictive indication, with reference to the appended drawing, of which.

DETAILED DESCRIPTION

Figure 1:
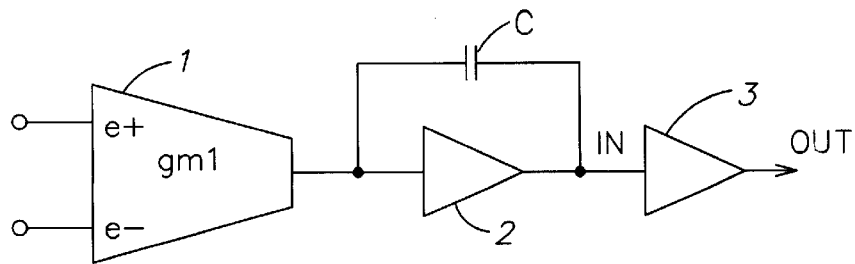
FIG. 1 is a schematic drawing of a power amplifier.
Figure 2:
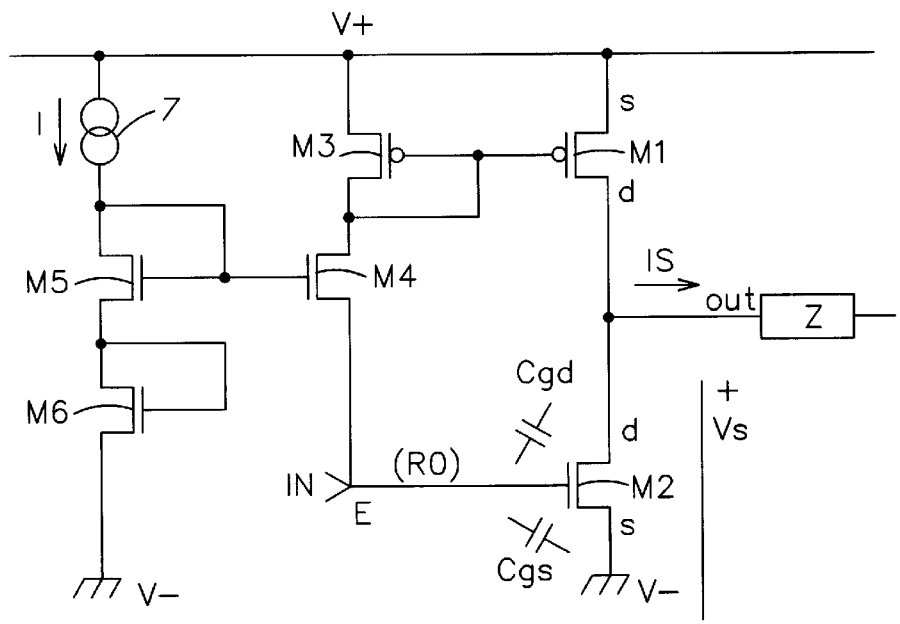
FIG. 2 shows an exemplary prior art push-pull assembly with complementary MOS transistors.
Figure 3:
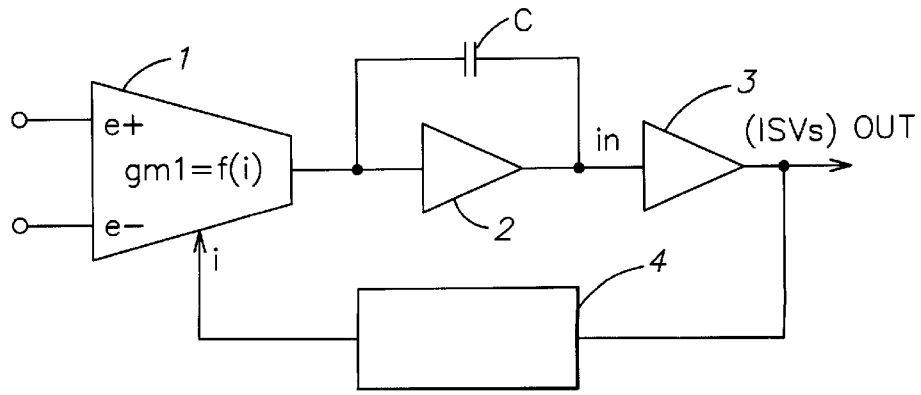
FIG. 3 is a schematic drawing of the power amplifier of the invention.

FIG. 3 shows the general principle of a power amplifier device according to the invention, comprising a feedback loop 4 between the output of the push-pull amplifier 3 and the input differential amplifier 1 for the temporary application of an additional current for the current biasing I of the input stage of the differential amplifier. Thus, its transconductance gm1 is temporarily increased at the passage of the conduction from one stage to another of the output push-pull amplifier.

Figure 4:
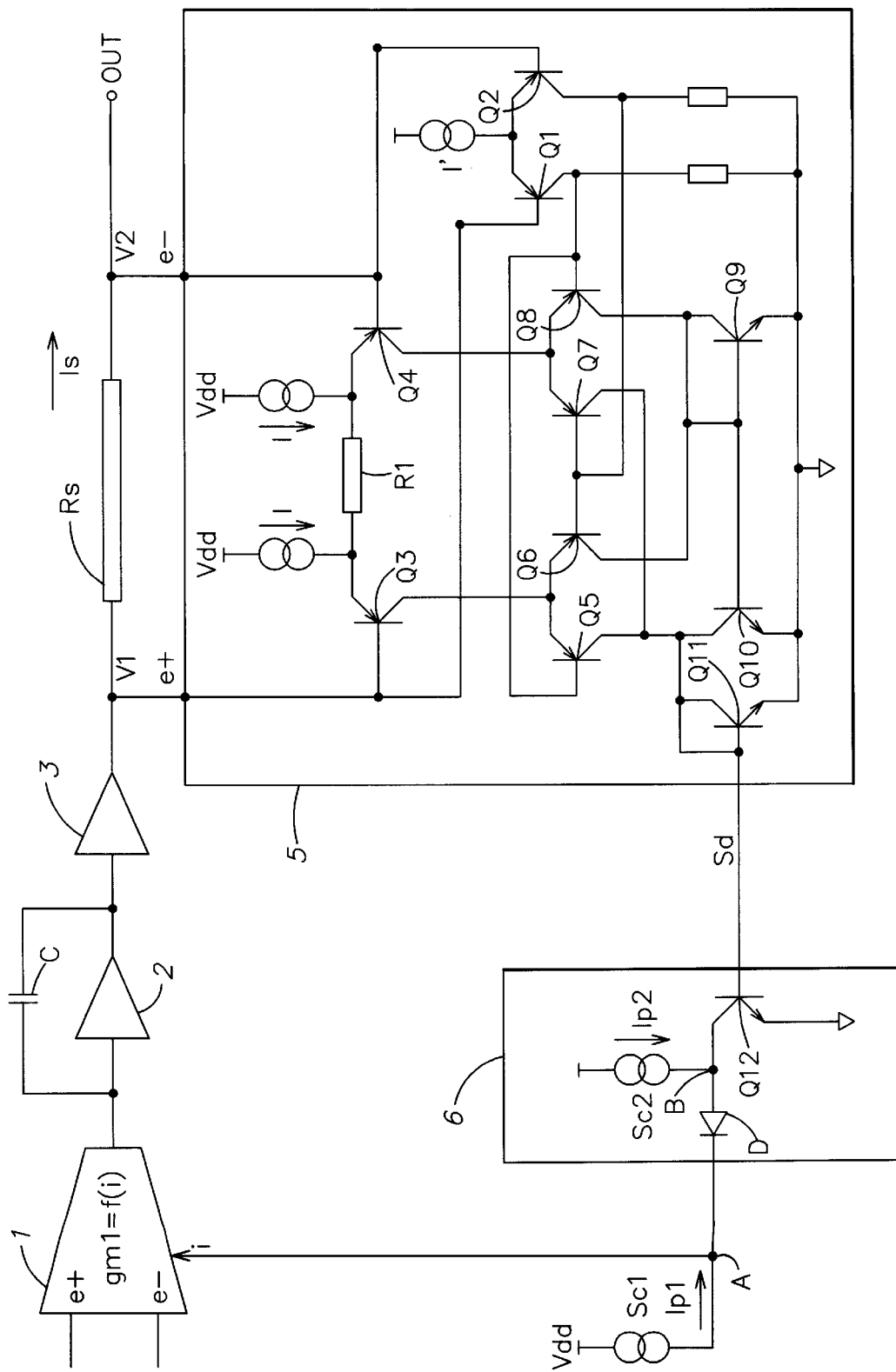
FIG. 4 is a schematic drawing of a feedback loop according to the invention in a bipolar embodiment.

The feedback circuit 4 includes means 6, FIG. 4, for the temporary application of an additional biasing current to the differential amplifier 1 and means to detect the passage of the output current to zero.

In an exemplary embodiment shown in FIG. 4, the means used for the temporary application of an additional biasing current include a current source SC2 delivering a current Ip2 at a terminal B. This terminal B is connected firstly to an input point A for the biasing of the differential amplifier. This input point receives the normal biasing current Ip1 of the differential amplifier from a current source SC1. The terminal B is also connected to a series transistor Q12 controlled by the detection means of the feedback loop. This series transistor Q12 is capable of absorbing at least a part of the additional biasing current Ip2. Finally, a protection diode D is preferably provided to prevent any branching of the bias current Ip1 by the transistor Q12.

The detection means must thus control the transistor Q12 so that it is on to absorb at least a part of the additional current Ip2 when the output amplifier is highly conductive and so that it is off (or very weakly on) at the passage of conduction from one stage to another. The current sources SC1, SC2 and the transistor Q12 are sized so that the criterion of stability is always met (Fgb>F1) and so that the variation of the transconductance gm1 of the differential amplifier 1 is not too sudden.

The detection of the passage of conduction from one stage to another may be a detection in voltage. In this case, a detection is made of a passage of the output voltage Vs through half of its maximum amplitude. If the push-pull amplifier is supplied between Vcc and the ground, the detection threshold will be in the range of Vcc/2. The detection of the passage of the conduction from one stage to another may be a current detection. In this case, the passage through zero of the current Is is detected at output of the amplifier.

FIG. 4 is a schematic drawing of a feedback circuit 4 with a current detection of this kind.

The current detection means include a detection resistor Rs series-connected with the output of the output push-pull amplifier 3. The terminals of the resistor give the voltages V1 and V2 respectively applied to the positive input e+ and the negative input e− of a differential amplifier whose output Sd controls the transistor Q12.

In the detailed example of FIG. 4, the feedback loop is made by bipolar technology. It can also be made by MOS technology.

In the example shown, the differential amplifier works as a common transmitter. It includes an input stage, a directional stage to process the sign of the current IS to be detected and an output stage that gives the control signal Sd.

The input stage has two input bipolar transistors Q3, Q4, that are biased in common emitter mode by the same current I, and a resistor R1 connected between its emitters.

The output stage with common emitter conventionally includes a transistor Q9 having their base and collector connected in common, and a transistor Q10 having its base connected to the base of the transistor Q9. There is thus a current mirror to dictate the same current in both transistors.

The directional stage includes a differential stage parallel-connected to the input stage. It has two transistors Q1, Q2 biased by a current I' on their emitters. The collector of each of these transistors controls one transistor of two pairs of transistors, one pair series-connected with the transistor Q3 and the other pair series-connected with the transistor Q4.

The first pair thus includes a transistor Q5 and a transistor Q6. The transistor Q5 has its base controlled by the collector of the transistor Q1 and its collector connected to the collectors of transistors Q7, Q10, and Q11. The transistor Q6 has its base controlled by the collector of the transistor Q2 and its collector connected to the collector of the transistor Q9.

The second pair includes a transistor Q7 and a transistor Q8. The transistor Q7 has its base controlled by the collector of the transistor Q2 and its collector connected to the collector of the transistor Q10. The transistor Q8 has its base controlled by the collector of the transistor Q1 and its collector connected to the collector of the transistor Q9.

Thus, the directional stage with a differential stage (Q1, Q2) and orientation pairs (Q5 to Q8) is used to connect the input stage and the output stage by either pair depending on the sign of the current IS to be detected.

An output transistor Q11 mounted as a common emitter, with its base and collector connected together and to the collector of transistor Q10, is used to control the current of the base of the transistor Q12.

Thus, when absolute value of the current Is is much greater than zero, there is a lot of current on the collector of the transistor Q10. Since the only current that can pass through is a limited current, fixed by current mirror by the transistor Q9, the additional current is absorbed by the transistor Q1. The transistor Q12 then becomes conductive and absorbs all or part of the current Ip2.

When the absolute value of the current Is is close to zero, all the current of the collector can be absorbed by Q10, the transistor Q11 lets through very little current or no current at all and the transistor Q12 lets through very little or no current. The current Ip2 is applied (wholly or in part) as an additional bias current of the input stage of the differential amplifier 1 whose transconductance gm1 increases.

The period of application of the current Ip2 as an additional bias current is adjusted by the current value I and resistance value R1 of the biasing of the input stage of the differential amplifier 5.

The invention can be implemented in different ways (in terms of detection and types of technology used). The two imperatives to be taken into account are that the feedback circuit should be faster than the output signal and that the transconductance of the differential amplifier should not be increased too suddenly.

A power amplifier is obtained without connection distortion and with high efficiency. This amplifier is especially suited to the low-frequency amplifiers and especially to those using a push-pull amplifier with complementary MOS transistors, such as the transistors of the vertical deflection frame circuits of television sets.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A power amplifier device, comprising a differential amplifier with determined transconductance followed by an intermediate amplification stage with a compensation capacitor between its output and its input and a push-pull output amplifier under low output impedance, for which a common point of connection between an upper stage and a lower stage gives an output of the device, the device further comprising a feedback loop between said output and a biasing node for biasing differential inputs of the differential amplifier and receiving a determined biasing current to temporarily increase the transconductance of said differential amplifier at the passage of the conduction from one stage to the other stage of the push-pull amplifier.

2. The amplifier device according to claim 1, wherein the feedback loop includes means for applying an additional current to the biasing node of the differential amplifier, the current applying means being controlled by detection means for detecting the passage of conduction from one stage to another of the push-pull amplifier.

3. The amplifier device according to claim 2, wherein the detection means are means to for detecting the passage through half of the maximum amplitude of the voltage at said output.

4. The amplifier device according to claim 2, wherein the detection means are means to for detecting the passage through zero of the output current.

5. The amplifier device according to claim 2, wherein the current applying means for applying an additional current include a source of said additional current at a terminal connected to the biasing node of the differential amplifier and connected in series with a transistor capable of absorbing at least a part of said additional current, said current applying means being controlled by said detection means.

6. The amplifier device according to claim 5, wherein a protection diode is connected between said terminal and the biasing node.

7. The amplifier device according to claim 5, wherein the current detection means include a detection resistor series-connected with the output of the device to give two voltage signals applied as positive and negative inputs of a detection differential amplifier, the output of which controls said transistor series-connected with the additional current source.

8. The amplifier device according to claim 7, wherein a duration of application of said additional current to the biasing node is set by current biasing means of the input stage of the detection differential amplifier.

9. The amplifier device according to claim 2, wherein the push-pull output stage is a stage with complementary MOS transistors, giving the output at their drains connected in common.

10. The amplifier device according to claim 3, wherein the current applying means for applying an additional current include a source of said additional current at a terminal connected to the biasing node of the differential amplifier and connected in series with a transistor capable of absorbing at least a part of said additional current, said current applying means being controlled by said detection means.

11. The amplifier device according to claim 4, wherein the current applying means for applying an additional current include a source of said additional current at a terminal connected to the biasing node of the differential amplifier and connected in series with a transistor capable of absorbing at least a part of said additional current, said current applying means being controlled by said detection means.

12. The amplifier device according to claim 10, wherein a protection diode is connected between said terminal and the biasing node.

13. The amplifier device according to claim 11, wherein a protection diode is connected between said terminal and the biasing node.

14. The amplifier device according to claim 6, wherein the current detection means include a detection resistor series-connected with the output of the device to give two voltage signals applied as positive and negative inputs of a detection differential amplifier, the output of which controls said transistor series-connected with the additional current source.

15. The amplifier device according to claim 14, wherein a duration of application of said additional current to the biasing node is set by current biasing means of the input stage of the detection differential amplifier.

16. The amplifier device according to claim 5, wherein the push-pull output stage is a stage with complementary MOS transistors, giving the output at their drains connected in common.

17. The amplifier device according to claim 11, wherein the push-pull output stage is a stage with complementary MOS transistors, giving the output at their drains connected in common.

18. The amplifier device according to claim 7, wherein the push-pull output stage is a stage with complementary MOS transistors, giving the output at their drains connected in common.

19. The amplifier device according to claim 14, wherein the push-pull output stage is a stage with complementary MOS transistors, giving the output at their drains connected in common.

20. The amplifier device according to claim 8, wherein the push-pull output stage is a stage with complementary MOS transistors, giving the output at their drains connected in common.

21. The amplifier device according to claim 15, wherein the push-pull output stage is a stage with complementary MOS transistors, giving the output at their drains connected in common.

22. A power amplifier comprising:

first amplifying means having a differential input and an output;

second amplifying means having an input connected to said output of said first amplifying means and an output, said input and output of said second amplifying means being connected to each other through a capacitor;

third amplifying means having an in put connected to said output of said second amplifying means and an output, said output of said third amplifying means being formed by a connection of a first stage and a second stage of said third amplifying means and which outputs an output voltage; and a feedback loop coupled between said output of said third amplifying means and a bias node of said first amplifying means, said feedback loop comprising bias means for increasing a transconductance of said first amplifying means upon the transfer of conduction from one of said first and second stages to the other of said first and second stages.

23. The device of claim 22, wherein said bias means comprises detection means for detecting the transfer of conduction from one of said first and second stages to the other of said first and second stages and current supply means for increasing a bias current applied at said bias node, said current supply means being controlled by said detection means.

24. The device of claim 23, wherein said current supply means comprises a first transistor having a control terminal connected to an output of said detection means, a first terminal coupled to said bias node and to a first current source and a second terminal connected to ground.

25. The device of claim 24, wherein said detection means turns said first transistor on when said third amplifying means is conducting, said transistor thereby shunting current from said current source to ground and wherein said detection means turns said first transistor off when said detection means detects said transfer of conductance, wherein said current supply means supplies said current to said bias node.

26. The device of claim 25, wherein said current supply means further comprising a diode connected between said first terminal of said first transistor and said bias node.

27. The device of claim 25, wherein said detection means detects said transfer of conduction when said output voltage reaches half of its maximum amplitude.

28. The device of claim 25, wherein said detection means detects said transfer of conduction when the absolute value of an output current at said output of said third amplifying means is zero.

29. The device of claim 25, further comprising a first resistor having a first terminal connected to said output of said third amplifying means and a second terminal.

30. The device of claim 29, wherein said detection means comprises a differential amplifier having a first input terminal connected said first terminal of said resistor and a second input terminal connected to said second terminal of said resistor and an output terminal connected to said control terminal of said transistor.

31. The device of claim 30, said differential amplifier further comprising an input stage including a second and third bipolar transistors having emitters connected together through a second resistor, each emitter of said second and third bipolar transistors being connected to a voltage supply through a current source, said second transistor having a base terminal connected to said first input terminal of said differential amplifier and said third transistor having a base terminal connected to said second input terminal of said differential amplifier.

32. The device of claim 31, said differential amplifier further comprising a directional stage including fourth and fifth transistors having emitters connected together, said fourth transistor having a base terminal connected to said base terminal of said second transistor and a collector terminal;

said fifth transistor having a base terminal connected to said base terminal of said third transistor and a collector terminal.

33. The device of claim 32, said direction stage further comprising:

sixth and seventh transistors having emitters connected together to a collector terminal of said second transistor, said sixth transistor having a base terminal connected to said collector of said fourth transistor and a collector terminal, said seventh transistor having a base terminal connected to said collector terminal of said fifth transistor and a collector terminal; and eighth and ninth transistors having emitters connected together and to a collector terminal of said third transistor, said eighth transistor having a base terminal connected to said collector terminal of said fifth transistor and a collector terminal, said ninth transistor having a base terminal connected to said collector terminal of said fourth transistor and a collector terminal.

34. The device of claim 33, said differential amplifier further comprising an output stage including tenth, eleventh and twelfth transistors, said tenth transistor having a collector terminal connected to said collector terminals of said seventh and ninth transistors, a base terminal connected to its collector terminal and an emitter terminal connected to ground;

said eleventh transistor having a collector terminal connected to said collector terminals of said sixth and eighth transistors, a base terminal connected to said base terminal of said tenth transistor and an emitter terminal connected to ground;

said twelfth transistor having a collector terminal connected to said collector terminal of said eleventh transistor, a base terminal connected to its collector terminal and to said output terminal of said differential amplifier and an emitter terminal connected to ground.

35. A method for reducing connection distortion in a push-pull amplifier device method comprising the steps of:

supplying a bias current to a bias node of said push-pull amplifier device monitoring an output of said push-pull amplifier device;

detecting a transfer of conductance in said push-pull amplifier device; and supplying a additional current to said bias node of said push-pull amplifier device when a transfer of conductance is detected in said detecting step.

* * * * *